United States Patent [19]

Taylor

[11] Patent Number: 4,516,021

[45] Date of Patent: May 7, 1985

[54] FIBER OPTIC MAGNETIC FIELD SENSOR

[76] Inventor: Henry F. Taylor, 7839 Midday La., Alexandria, Va. 22306

[21] Appl. No.: 406,427

[22] Filed: Aug. 9, 1982

[51] Int. Cl.³ .............................................. G02B 5/14
[52] U.S. Cl. ............................... 250/227; 250/231 R; 324/96
[58] Field of Search .................. 324/96, 244; 250/227, 250/231 R, 225; 356/351, 33, 73.1; 73/655–657; 455/610, 612

[56] References Cited

U.S. PATENT DOCUMENTS

| | | | |
|---|---|---|---|
| 3,693,082 | 9/1972 | Jaecklin | 324/96 |
| 4,173,412 | 11/1979 | Ramsay et al. | 356/33 |
| 4,255,018 | 3/1981 | Ulrich et al. | 324/96 |
| 4,269,483 | 5/1981 | Feldtkeller | 324/96 |
| 4,298,245 | 11/1981 | Aulich et al. | 324/96 |
| 4,370,612 | 1/1983 | Puech et al. | 324/96 |
| 4,442,350 | 4/1984 | Rashleigh | 356/33 |

*Primary Examiner*—David C. Nelms
*Attorney, Agent, or Firm*—Robert F. Beers; William T. Ellis

[57] ABSTRACT

An optical fiber magnetometer utilizing, in one embodiment, a birefringment optical fiber in combination with a magnetostrictive block for inducing strains in the fiber in response to an applied magnetic field to thereby cause a change in the degree of birefringence of the fiber. This change in birefringence is measured by directing the light exiting the fiber through a conversion element such as a polarizer or a prism and then detecting the resulting intensity modulation in a photodetector.

A variety of inventive features are set out in this disclosure including the use of spliced fibers with a 90 degree axis rotation to compensate for environmental effects, the use of a twisted fiber for gradient field sensing, and the rotation of the sensor fiber to eliminate low-frequency noise and to obtain a vector field and field gradient sensing capability.

23 Claims, 9 Drawing Figures

FIG. 4(a) COILED SENSOR CONFIGURATION

FIG. 4(b) CROSS SECTION OF SENSOR COIL

FIBER OPTIC MAGNETIC FIELD SENSOR

BACKGROUND OF THE INVENTION

The present invention relates generally to devices for detecting very small magnetic fields and magnetic field gradients and more particularly, to devices for detecting such small magnetic fields and gradients by means of optical fiber light modulation.

Magnetic field sensors may be utilized in a variety of applications such as sensing the earth's magnetic field, warfare sensing applications, and in Geophysical earth exploration. Of particular interest, is the applicability of these devices for use in anti-submarine or anti-ship warfare and mine detection. Typically, the magnetic fields set up by the metallic structure of moving ships or submarines is quite small, on the order of $10^{-7}$ gauss or less.

Presently, the best performance for detection of small magnetic fields in the $10^{-7}$–$10^{-10}$ Gauss range is obtained with superconducting quantum interference (SQUID) devices. However, since SQUID magnetometers are cryogenic devices which must be cooled to 4° K., they require considerable support and maintenance in comparison with conventional electronic devices which operate at ambient temperatures. In addition. SQUID magnetometers are expensive (up to $50,000 per instrument), have low reliability, and their performance degrades severely in high-vibration military environments. Recently the use of a fiber optic interferometer as a sensitive magnetometer was proposed (Yariv and Winsor, Opt. Lett. 5, 87 (1980)) and demonstrated (Dandridge, et al., Electron. Lett., 16, (1980)). Those references describe a device in which a magnetostrictive material introduces a strain proportional to the ambient magnetic field into a sensing fiber. This strain changes the optical path length of one arm of the interferometer relative to that of the other arm, leading to a change in relative intensities of the optical outputs from the interferometers. The interferometer output beams are sensed by photodetectors, which provide an electrical signal from which the amplitude of the ambient magnetic field can be determined.

Unfortunately, such interferometers are also very good sensors of temperature and thermal gradients, acoustic pressure, vibration and other environmental affects. Thus, in order to reach the theoretical sensitivity of $10^{-12}$ Gauss expected with no environmental affects present, it is necessary to eliminate or cancel out these environmental effects. However such cancelation is difficult to achieve in a practical instrument.

OBJECTS OF THE INVENTION

Accordingly, it is an object of the present invention to provide a fiber optic magnetometer which is simple in construction, low in cost, and is relatively immune to environmental effects.

It is a further object of the present invention to provide a magnetometer which has a high field sensitivity relative to interferometric fiber optic magnetometers.

It is yet a further object of the present invention to provide a magnetometer capable not only of vector-magnetic field sensing, but also magnetic field-gradient sensing.

It is a still further object of the present invention to provide a highly sensitive magnetometer which is relatively immune to environmental effects and which is operable at room temperature.

Other objects, advantages, and novel features of the present invention will become apparent from the detailed description of the invention, which follows the summary.

SUMMARY OF THE INVENTION

Briefly, the present invention comprises the combination of a length of birefringent optical fiber; a light source for introducing light signals with both polarizations into the optical fiber so that both polarizations propagate therein; a device for modulating the birefringence in a portion of the optical fiber in accordance with a magnetic field to be sensed; and a device for converting this birefringence modulation to intensity modulation and detecting this intensity modulation.

In one embodiment, the birefringence modulator is realized by a magnetostrictive element and a support structure disposed to compress a portion of the optical fiber therebetween with a compression force related to a magnetic field to be sensed.

In another embodiment, the conversion element may be realized by a device for separating the light output from the fiber into two orthogonally polarized output light signals which may then be detected in separate photodetector channels and the difference signal therefrom applied to control a phase bias element on the optical fiber. This embodiment permits the cancelization of noise and drift in the system.

In yet another embodiment the birefringence modulator includes a magnetostrictive element which is designed to compress a coil of optical fiber against a support structure in response to a magnetic field to be sensed. This magnetostrictive element design may conveniently take the form of a hollow cylinder with the support structure comprising a first cylinder disposed inside of the magnetostrictive cylinder and a second outer cylinder concentric with the magnetostrictive cylinder. The fiber coil may then be wound around the first cylinder or around the magnetostrictive cylinder.

In order to cancel out birefringence changes caused by temperature variations, the fiber coil may be formed by splicing together an even number of fiber sections of equal length with the axes of the fiber rotated by 90° at each splice.

Additionally, in order to avoid low-frequency noise and drift in the optical source, detectors, and electronic amplifiers, the optical fiber system may be rotated in order to allow ac detection schemes to be utilized.

Finally, a gradient magnetometer may be realized by coiling on a cylinder a continuous length of birefringent optical fiber which is twisted at the rate of one-half twist per circumference of the coil. Birefringent modulation of the embodiment may be obtained in a fashion similar to that set out for the optical fiber coil noted earlier. Again, the system may be rotated about its coil axis in order to permit ac detection techniques to be used to measure the field gradient.

BRIEF DESCRIPTION OF THE DRAWINGS

FIG. 4(a) is a cross-sectional drawing of an optical fiber birefringence modulator for an optical fiber coil.

FIG. 4(b) is a cross-sectional view along the line A—A of the birefringence modulator of FIG. 4(a).

DETAILED DESCRIPTION OF THE PREFERRED EMBODIMENT

Figure 1:
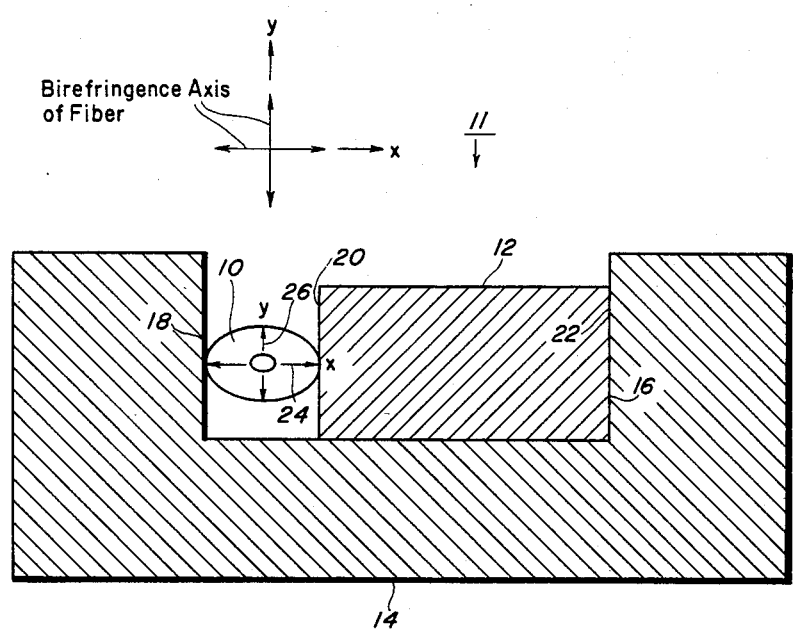
FIG. 1 is a cross-sectional drawing of one embodiment of the optical fiber birefringence modulator utilized in the present invention.

Referring now to the drawings, wherein like reference characters designate like or corresponding parts throughout the views, FIG. 1 sets forth one embodiment of the magnetic sensor element utilized in the present invention. This magnetic sensor element utilizes a birefringent single mode fiber and is designed to induce strains in the optical fiber in accordance with as applied magnetic field to be sensed in order to change or modulate the degree of birefringence of the fiber.

In general, the term birefringence refers to a characteristic of a material in which the velocity of light is not the same in all directions in the material resulting in the separation of the rays of light into two unequally refracted polarized rays. Such birefringence is found in a variety of crystalline substances. Typically, such crystalline substances have two indices of refraction; the ordinary index which refers to radiation polarized with its electric vector perpendicular to the optic axis; and the extraordinary index which refers to radiation with its electric field vector parallel to the optic axis. The optic axis is typically referred to as the fast axis and radiation polarized with its electric field vector parallel to this axis has a faster speed of propagation through the crystalline substance than radiation polarized with its electric vector perpendicular to this optic or fast axis. Accordingly, light propagating through a birefringent material will have two different polarized components with a phase difference therebetween caused by the difference in the speed of propagation through the crystalline material.

It is known that noncrystalline, amorphous materials such as glasses can also possess the property of birefringence. In particular, birefringence is commonly observed in glass or silica optical fibers. A variety of manufacturers are now making special birefringent optical fiber available to industry. It has been found that when a strain or compression force is placed on such a birefringent optical fiber, the degree of birefringence of the fiber will vary in accordance with the force. This birefringence variation will cause a variation in the phase difference between the different polarizations propagating in the fiber. The present inventive design utilizes this strain-induced birefringence variation to form a magnetometer. One configuration for this magnetometer is set forth as 11 in FIG. 1 and comprises a birefringent single mode optical fiber 10, and a magnetostrictive component 12 disposed in a support structure 14 in such a fashion as to cause a compression force to be exerted on the optical fiber in the presence of a magnetic field thereby changing or modulating the birefringence of the fiber. In the embodiment shown in FIG. 1, the magnetostrictive material 12 is shaped in the form of a block and the support structure is shaped to have two opposing walls 16 and 18 with a space therebetween for holding the magnetostrictive block 12 and a portion of the optical fiber 10. The block is situated so that two of its opposing faces 20 and 22 are disposed between the opposing walls 16 and 18 such that one face 22 is in contact with one of the opposing walls 16, while the other face 20 is in contact with the portion of the optical fiber 10 so that the block 12 compresses that portion of optical fiber against the wall 18. It has been found that if a block of magnetostrictive material is utilized which is large with the respect to the size of the optical fiber 10, then a large mechanical pressure is exerted on the optical fiber which enhances the sensitivity of the design. In a preferred embodiment, one of the birefringent axes 24 or 26 is aligned along the direction in which the compression force is applied so that a maximum change in birefringence is achieved.

In operation, when a magnetic field is present, the magnetostrictive block 12 changes dimensions by either expanding or contracting in accordance with the magnetic field component to be sensed. This contraction or expansion of the magnetostrictive block 12 varies the pressure on the optical fiber 10, and thus the birefringence thereof. The birefringence of the optical fiber may be given as a function of the magnetic field H by the equation $$\Delta n = n_{yo} - n_{xo} + KH,$$

where $n_{yo}$ and $n_{xo}$ are the refractive indices of the fiber for polarization along the y and x axes, respectively, in the absence of an applied field, and K is a proportionality constant. In essence, the magnetic field causes the magnetic material to expand or contract, introducing an anisotropic strain into the fiber material. The change in the birefringence of the fiber resulting from this strain is determined by the strain-optic coefficients of the fiber material.

Figure 2:
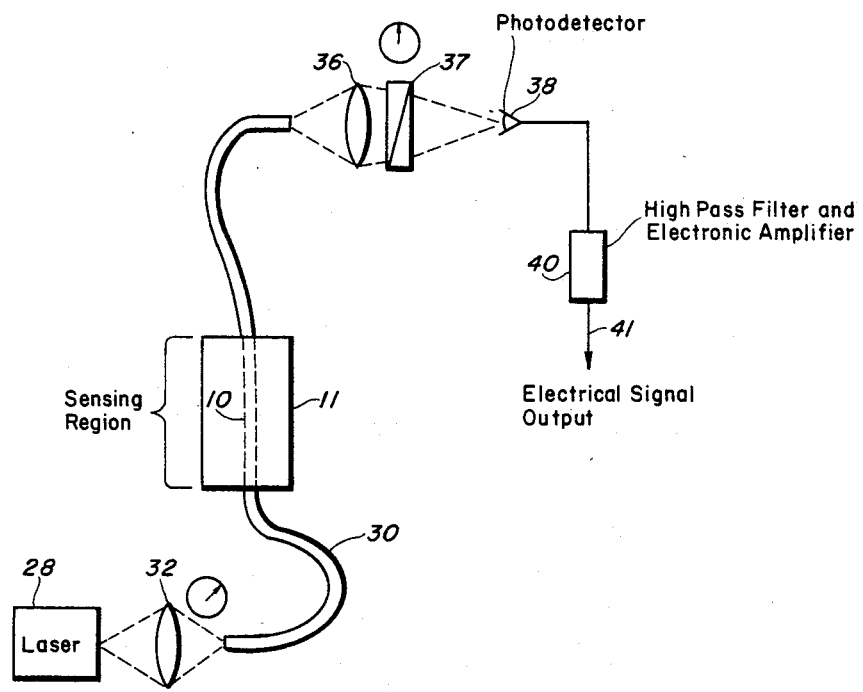
FIG. 2 is a schematic diagram of one embodiment of the magnetic sensor system of the present invention utilizing the birefringent modulator of FIG. 1.

An optical magnetic field sensing system utilizing the birefringence modulator shown in FIG. 1 is illustrated in FIG. 2. Therein, linearly polarized light, from an optical 28 source such as a laser, is coupled into one end of the birefringent single mode fiber 30. It is important in order to be able to detect changes in the birefringence property of the optical fiber to have light in both polarization states propagating in the fiber. Accordingly, the linearly polarized light coupled into one end of the fiber 30 should have a polarization vector oriented at some direction other than parallel to either of the birefringence axes 24 or 28 of the fiber. For convenience, the polarization vector for this laser light may be oriented at approximately 45° relative to the birefringence axis of the fiber 30. The coupling of the light into the Fiber 30 may be accomplished conveniently by a lens 32. The optical fiber 30 is then run through the birefringence modulator 11 shown in FIG. 1. The portion of the optical fiber disposed within this birefringence modulator is designated again, as 10. Light transmitted through the optical fiber 30 is then coupled, by a lens 36, for example, to a conversion element 37 which acts to convert this birefringence modulation to light intensity modulation. A number of different conversion element configurations can be utilized to realize this conversion function. By way of example, a polarizer film may be utilized with its axis oriented also at 45° with respect to the fiber birefringence axis. The polarizer 37 acts to pass light of one linear polarization and blocks light of the orthogonal polarization. It is set preferably to pass light at 45° (maximum sensitivity) to the optical fiber polarization axis in order to pass both propagating polarizations. The polarizer acts to produce interference between the two orthogonally polarized waves propagating in the fiber to thereby yield an intensity modulation. The light propagating through this conversion element is then focused onto a detection device 38 for generating an output signal proportional to the intensity of the light impinging thereon. By way of example, this detection device 38 may be realized by a photodetector. Any change in the phase shift produced in the sensing birefringent modulator 11 caused by the presence of a magnetic field leads to a change in the intensity modulation of the light passing through the conversion element 37. The electrical signal output from the photodetector 38 which is proportional to this intensity modulation it is then passed through a high pass filter and electronic amplifier 40 in order to remove the dc component of the signal and to amplify the ac signal remaining. The ac signal output is taken from line 41.

Figure 3:
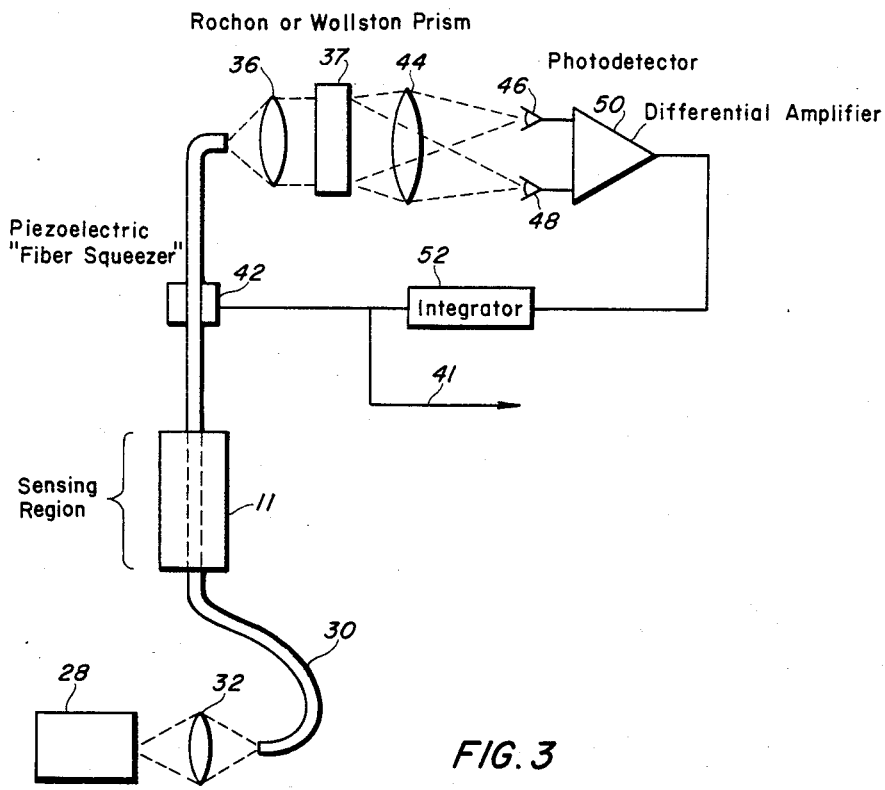
FIG. 3 is a schematic diagram of the magnetic field sensor of FIG. 1 with the addition of a feedback loop to maintain maximum sensitivity by equalizing photodetector outputs.

Depending on the systems components utilized in FIG. 2, there are certain low frequency noise components (slow flucuations) and drifts present in the system. FIG. 3 illustrates a sensor configuration with dual optical outputs and a feedback design in order to cancel the effect of this low frequency noise and drift in the system and thereby maintain operation at maximum sensitivity to small phase shifts. This cancellation of the low frequency noise and drifts in the system is achieved by inserting a device 42 for applying pressure to a second portion of the optical fiber 30 in accordance with a control signal generated in the system. The control signal is generated by modifying the system shown in FIG. 2 to include a Rochon or Wollaston prism as the conversion element 37 to separate the output light signal into two orthogonally polarized output light beams, which are modulated in a complementary fashion. These two orthogonally polarized output beams may then be focused by a lense 44 on to two separate photodetectors 46 and 48. The electrical signals from the photodetectors 46 and 48 may then be applied to a differencing device 50, such as, by way of example, a differential amplifier. The difference signal obtained from the differencing device 50 is then utilized after integration in an integrator 52, as the control signal for the pressure applying device 42. This pressure applying device 42 may be conveniently realized by a piezoelectric "fiber squeezer". For efficiency, this piezoelectric element 42 should be positioned to apply pressure to the fiber 30 along one of its birefringent axis. By incorporating this piezoelectric element 42 into the feedback loop driven by the difference signal from the two photodetector channels, an arbitrary relative phase change can be produced to maintain the polarization signals equal in intensity and to cancel very slow fluctuation noise in the polarization intensity to due to environmental effects such as temperature. Additionally, as noted above the piezoelectric element is utilized to allow the sensor system to operate at maximum sensitivity to small phase shifts. This is accomplished by biasing the phase shift between the polarization components so that it is equal to 90 degrees, the point on the phase shift curve with the largest slope which yields the maximum sensitivity to small phase shifts.

Although less sensitive to environmental effects than the interferometric magnetometer of the prior art, the sensor disclosed in FIG. 1 is still affected to some extent by temperature variations since the degree of birefringence is a function of temperature. An embodiment is set forth in FIG. 4 which avoids these environmental effects. The configuration shown in FIG. 4(a) is a structure 58 for exerting a compression force on a fiber coil in order to modulate the birefringence of the fiber coil in accordance with a magnetic field to be sensed. The structural configuration of FIG. 4(a) comprises a first inner cylinder 60 of non-magnetic material symmetrical about an axis 59, a hollow cylinder of magnetostrictive material 62 disposed concentrically around the first inner cylinder 60, a fiber coil 64 wound around the outer surface of the magnetostrictive cylinder 62, and a hollow second outer cylinder 66 disposed concentrically around the magnetostrictive cylinder 64 such that the coil 64 of optical fiber is compressed between the hollow outer cylinder 66 and the cylinder of magnetostrictive material. It is clear from a viewing of this structure, that when the magnetostrictive cylinder 62 expands and contracts in response to a magnetic field, it will exert a compression force on the fiber coil 64. It should be understood from the above discussion, that the fiber coil could just as easily be wound around the outer surface of the first inner cylinder 60 such that the fiber coil 64 is compressed between the first inner cylinder 60 and the inner wall of the magnetostrictive cylinder 62.

Light signals are introduced into the optical fiber coil 64 via the laser 28 and the modulated intensity of the light propagating in the fiber is detected by the photodetector 38.

Figure 4C:
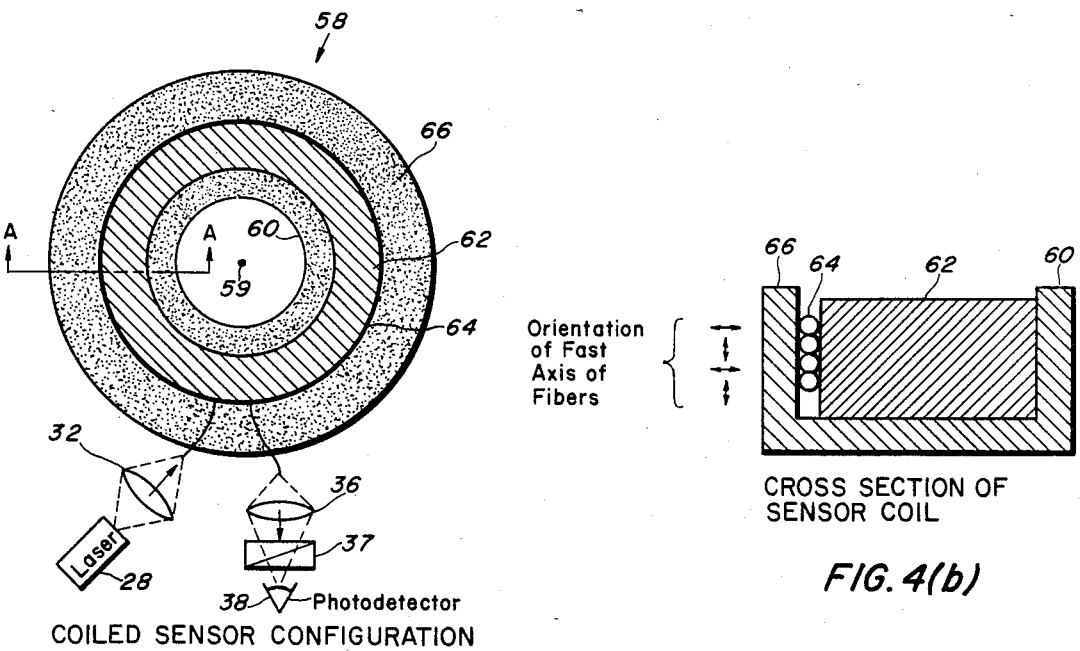
FIG. 4(c) is a perspective drawing of the splice arrangement utilized in FIG. 4(b).
Figure 4C:
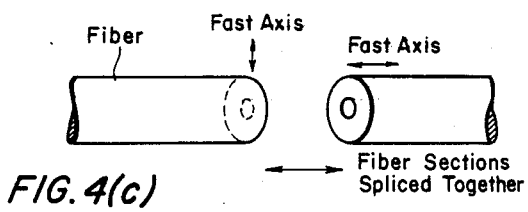

It has been found that when the optical coil 64 is composed of an even number of spliced shorter sections of optical fiber of approximately of equal length spliced together end-to-end, with the birefringence axis of the fibers rotated by 90 degrees at each splice. as illustrated in FIG. 4(b), then the birefringence variation of the optical fiber becomes independent of temperature. FIG. 4 (b) is a cross-sectional view of the cylindrical structure of FIG. 4(a) along the lines A—A. The arrows to the left of the optical fiber coils 64 show the orientation of the fast axis of each loop of the fiber. The fiber splicing for this coil is accomplished simply by butting the ends of the fiber sections together and using an electric arc to fuse them together in a fiber splicing machine. In this type of composite fiber, the net birefringence will be equal to 0, independent of temperature, unless a magnetic field is present which is to be sensed. Although theoretically, any length can be chosen for the fiber sections, best cancellation of temperature effects is obtained when the length of each segment equals the circumferance of the spool upon which the fiber is wound. If the length of each segment is made to equal the circumferance of the spool, then each turn of the fiber coil is affected by temperature changes in the same way as the preceding fiber turn is affected and exactly cancels the response of the preceding turn to that change. FIG. 4(c) shows the splice arrangement illustrating the 90 degree rotation of the fiber ends at each splice.

Figure 5:
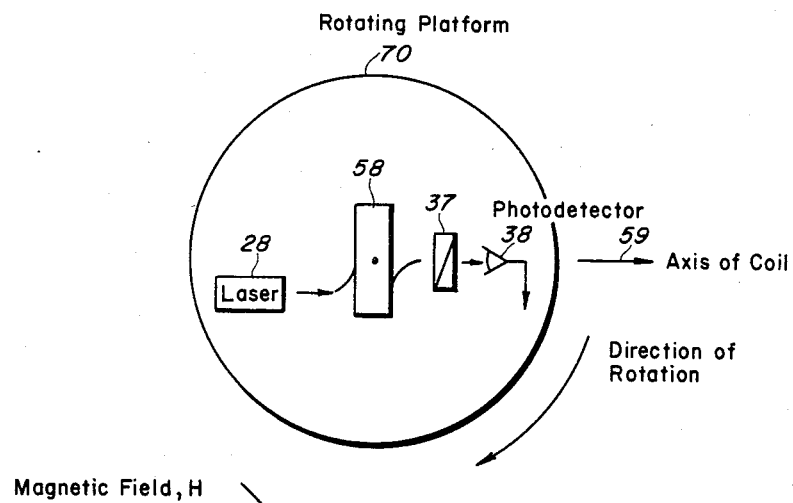
FIG. 5 is a schematic diagram of a rotating coil fiber optic magnetic sensor.

In some magnetic field sensor applications, the magnetic field varies at very low frequencies (less than 1 Hertz). Accordingly. low-frequency noise and drift in the optical source, detecters, and electronic amplifiers can severely degrade the performance of the magnetic field sensor. In order to avoid this noise problem, the optical fiber sensor may be rotated about an axis. This rotation feature may be applied to the designs shown in FIG. 2 and FIG. 3 which would be rotated about an axis perpendicular to the fiber. However, the rotation option is especially advantageous for use with the coil design of FIG. 4. When the coil design of FIG. 4 is rotated, it is rotated about an axis generally perpendicular to the axis of the coil. An embodiment for implementing this rotation feature with respect to FIG. 4 is shown in FIG. 5. The FIG. 4 sensor system is shown disposed on a rotating platform 70. The structure 58 is shown disposed so that its axis 59, which is coincident with the axis of the coil 64, is directed to the right as shown in the figure. Again, a laser 28 is shown for introducing light to propagate in the fiber and an analyzer 37 and a photodetector 38 are shown for operating on the light signals from the fiber. It is understood that some means may be required for focusing the light into and out of the fiber, although none is shown in the figure for ease of representation.

The magnetic field being sensed is a vector quantity. Accordingly, as the optical fiber coil is rotated, the intensity modulation of the light, which is proportional to the magnetic vector field, will have two peaks 180 degrees apart in the rotation. Thus, rotating the coil provides an ac output signal at twice the rotation frequency. This rotation frequency may be conveniently in the 100-1000 Hertz range. In essence, the intensity modulation response has been converted up to an ac frequency thereby allowing ac heterodyne or phase-sensitive detection schemes to be used to eliminate most of the low-frequency noise. The low-frequency noise occurring due to thermal gradients and noise and drift in the optical source, detecters, and electronic amplifiers does not have a vector nature. Thus, it is not shifted up to a frequency at twice the rotation frequency. Furthermore, such rotation would provide a 2-dimensional vector field measurement capability, in which only magnetic fields in the plane perpendicular to the coil axis would be sensed. The orientation of the field in that plane could be determined by measuring the phase of the output signal.

Figure 6A:
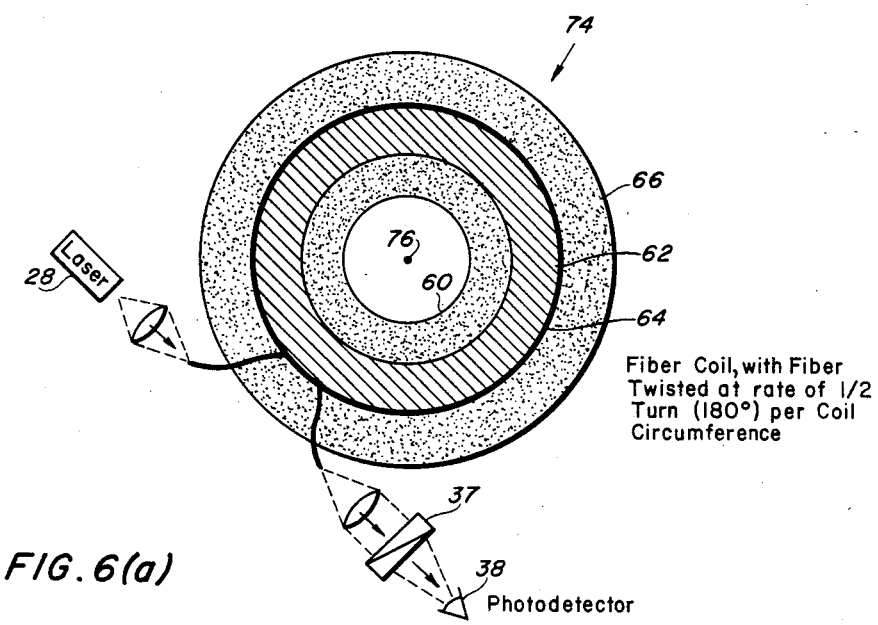
FIG. 6(a) is a top view of an optical fiber coil birefringence modulator similar to FIG. 4(a).
Figure 6B:
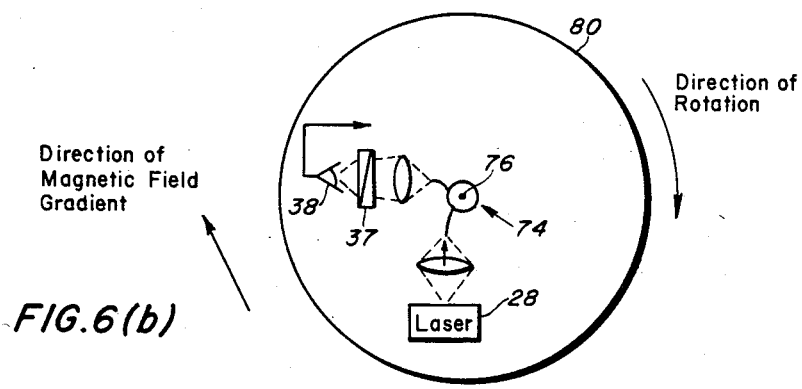
FIG. 6(b) is a schematic diagram of a rotating platform arrangement for the birefringence modulator of FIG. 6(a).

A design for a gradient magnetometer is shown in FIG. 6. This design utilizes a continuous length of twisted birefringent fiber coiled on a cylinder in a similar fashion to FIG. 4(a). The structure of FIG. 6(a) again comprises a first inner cylinder 60, a concentric magnetostrictive cylinder 62, and a second outer cylinder 66 disposed concentrically over the magnetostrictive cylinder 62. The optical fiber coil may be wound either on the outer surface of the inner cylinder 60 or on the outer surface of the magnetostrictive cylinder 62 in order to obtain a compression force to modulate the birefringence of the optical fiber. However, in FIG. 6(a), the optical fiber is twisted at rate of approximately ½ twist per circumference of the coil, so that the increase in birefringence for ½ of the optical fiber due to a uniform magnetic field is cancelled by the increase in birefringence for the other half of the fiber. Only if a magnetic field gradient is present will a net change in the birefringence occur and be detected. In order to enable ac detection to be used in measuring this gradient, the coil may be rotated about its axis as shown in FIG. 6(b). The structure 74 of FIG. 6(a) is disposed on a rotating platform 80 with the axis of the coil 76 parallel to the axis of the rotating platform 80.

The output signal from such a gradient magnetometer is at the rotation frequency, so that low-frequency noise may be removed by heterodyne or phase-sensitive detection. It should be noted that the gradient magnetometer may be designed to make use of segments of fibers spliced together with 90 degree axis rotation at the splices in order to eliminate noise from environmental effects, as discussed previously and illustrated in FIG. 4. With such a design, the length of the fiber between splices should equal the coil circumference, and an even number of fiber segments should once again be used.

With this type of gradient magnetometer, it will be possible to detect magnetic field gradients relative to the earth's magnetic field. It may also be possible to make provision in the system to enable the estimation of distance from a magnetic field source.

The foregoing has set forth a variety of magnetometer embodiments based on the modulation of the birefringence of an optical fiber by means of magnetic field induced compression forces. These various embodiments provide a significantly higher sensitivity device, with greater immunity to environmental effects, lower cost, vector-field and field-gradient sensing capablilities, and with the capability of room-temperature operation.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A magnetic field sensing field system comprising:
a length of birefringent optical fiber with an input end and an output end;
a light source for introducing light signals with polarization components in each of the birefringent axes into said input end of said optical fiber so that both light polarizations propagate therein;
a device for modulating the birefringence in a portion of said optical fiber in accordance with a magnetic field to be sensed;
a conversion element for converting the birefringence modulation to light intensity modulation; and
means for detecting the light output signal from said conversion element;
wherein said birefringent modulating device includes
a support structure;
a section of magnetostrictive material, which is large compared to the size of said portion of optical fiber, disposed relative to said portion of optical fiber and said support structure to cause a compression force to be exerted in the radial direction on the optical fiber in the presence of a magnetic field thereby changing its birefringence.

2. A magnetic field sensing system comprising:
a length of birefringent optical fiber with an input end and an output end;
a light source for introducing light signals of both polarizations into said input end of said optical fiber so that both light polarizations propagate therein;
a device for modulating the birefringence in a portion of said optical fiber in accordance with a magnetic field to be sensed;
a conversion element for converting the birefringence modulation to light intensity modulation; and
means for detecting the light output signal from said conversion element;

wherein said birefringence modulating device includes
a support structure shaped to have two opposing walls with a space therebetween;
wherein said portion of optical fiber is disposed to run in the space between said opposing walls; and
a block of magnetostrictive material with two opposing faces disposed between said opposing walls such that one face is in contact with one of said opposing walls and the second face is in contact with said portion of optical fiber such that said block compresses said portion of optical fiber against the other of said opposing walls.

3. A sensing system as defined in claim 1 or 2, wherein:
one of the birefringent axes of said portion of optical fiber is aligned approximately in the direction in which the compression force is exerted thereon.

4. A sensing system as defined in claim 3, wherein said conversion element is a polarizer.

5. A sensing system as defined in claim 4, further comprising:
a rotating platform upon which said system is disposed, said platform rotating about an axis perpendicular to said optical fiber.

6. A sensing system as defined in claim 1:
wherein said conversion element further comprises means for separating the output light signal from the output end of said optical fiber into two orthogonally polarized output beams;
wherein said detecting means includes a pair of photodetectors for detecting said orthogonally polarized output beams; and
further comprising means for subtracting the output signal of one photodetector from the output signal of the other photodetector to obtain a difference signal.

7. A sensing system as defined in claim 6, wherein:
one of the birefringent axes of said portion of optical fiber is aligned approximately in the direction in which the compression force is exerted thereon.

8. A sensing system as defined in claim 7, further comprising:
a rotating platform upon which said system is disposed, said platform rotating about an axis which is perpendicular to said optical fiber.

9. A sensing system as defined in claim 6, further comprising:
means for applying pressure to a second portion of said optical fiber; and
means for generating a control signal from said difference signal for controlling the pressure applied by said pressure applying means in accordance therewith.

10. A sensing system as defined in claim 9
wherein said pressure applying means comprises a piezoelectric fiber squeezer; and
wherein said control signal generating means comprises a signal integrator.

11. A sensing system as defined in claim 9, wherein:
one of the birefringent axes of said portion of optical fiber is aligned approximately in the direction in which the compression force is exerted thereon by said magnetostrictive material.

12. A sensing system as defined in claim 11, further comprising:
a rotating platform upon which said system is disposed.

13. A sensing system as defined in claim 1,
wherein said portion of optical fiber comprises a coil with a longitudinal axis; and
wherein said section of magnetostrictive material is disposed relative to said coil and said support structure to cause a compression force to be exerted on said coil.

14. A sensing system as defined in claim 13,
wherein said coil is composed of an even number of spliced shorter sections of optical fiber of approximately equal length spliced together end-to-end with the birefringence axes of the fibers rotated by 90° at each splice.

15. A sensing system as defined in claim 13, wherein said coil is formed of optical fiber, with said optical fiber being twisted at the rate of one-half twist per circumference of the coil.

16. A sensing system as defined in claim 14, wherein said coil is formed of optical fiber, with said optical fiber being twisted at the rate of one-half twist per circumference of the coil.

17. A sensing system as defined in claim 15, further comprising a rotating platform upon which said sensing system is disposed, said platform rotating about an axis generally perpendicular to the axis of said coil.

18. A sensing system as defined in claim 16, further comprising a rotating platform upon which said sensing system is disposed, said platform rotating about an axis generally perpendicular to the axis of said coil.

19. A sensing system as defined in claim 13,14,15, or 16, wherein said support structure comprises:
a first inner cylinder; and
a hollow second outer cylinder;
wherein said section of magnetostrictive material has the shape of a hollow cylinder and is disposed concentrically around said first inner cylinder and in contact therewith;
wherein said coil is wound around the outer surface of said cylinder of magnetostrictive material; and
wherein said hollow second outer cylinder is disposed concentrically around said cylinder of magnetostrictive material such that said coil of optical fiber is compressed between said hollow outer cylinder and said cylinder of magnetostrictive material.

20. A sensing system as defined in claims 13,14,15, or 16, wherein said support structure comprises:
a first inner cylinder; and
a hollow second outer cylinder:
wherein said coil is wound around the outer surface of said first inner cylinder;
wherein said section of magnetostrictive material has the shape of a hollow cylinder and is disposed concentrically around said first inner cylinder such that said coil of optical fiber is compressed between said inner cylinder and said cylinder of magnetostrictive material; and
wherein said hollow second outer cylinder is disposed concentrically around said cylinder of magnetostrictive material in a touching relationship.

21. A sensing system as defined in claims 13 or 14, further comprising a rotating platform upon which said sensing system is disposed, said platform rotating about an axis generally perpendicular to the axis of said coil.

22. A sensing system as defined in claim 19, further comprising a rotating platform upon which said sensing system is disposed, said platform rotating about an axis generally perpendicular to the axis of said coil.

23. A sensing system as defined in claim 20, further comprising a rotating platform upon which said sensing system is disposed, said platform rotating about an axis generally perpendicular to the axis of said coil.

* * * * *